US010669297B2

(12) United States Patent
Adermann et al.

(10) Patent No.: US 10,669,297 B2
(45) Date of Patent: Jun. 2, 2020

(54) PROCESS FOR THE GENERATION OF THIN INORGANIC FILMS

(71) Applicant: BASF SE, Ludwigshafen am Rhein (DE)

(72) Inventors: Torben Adermann, Heidelberg (DE); Daniel Loeffler, Birkenheide (DE); Hagen Wilmer, Ludwigshafen (DE); Kerstin Schierle-Arndt, Zwingenberg (DE); Jan Gerkens, Goettingen (DE); Christian Volkmann, Goettingen (DE); Sven Schneider, Goettingen (DE)

(73) Assignee: BASF SE, Ludwigshafen am Rhein (DE)

( * ) Notice: Subject to any disclaimer, the term of this patent is extended or adjusted under 35 U.S.C. 154(b) by 130 days.

(21) Appl. No.: 15/779,893

(22) PCT Filed: Nov. 30, 2016

(86) PCT No.: PCT/EP2016/079213
§ 371 (c)(1),
(2) Date: May 30, 2018

(87) PCT Pub. No.: WO2017/093283
PCT Pub. Date: Jun. 8, 2017

(65) Prior Publication Data
US 2018/0346501 A1    Dec. 6, 2018

(30) Foreign Application Priority Data

Dec. 2, 2015   (EP) ..................................... 15197604

(51) Int. Cl.
*C09D 1/00*      (2006.01)
*C07F 15/06*     (2006.01)
(Continued)

(52) U.S. Cl.
CPC ............ *C07F 15/065* (2013.01); *C01B 33/06* (2013.01); *C09D 1/00* (2013.01); *C09D 5/021* (2013.01);
(Continued)

(58) Field of Classification Search
CPC ........................................................ C09D 1/10
See application file for complete search history.

(56) References Cited

U.S. PATENT DOCUMENTS

2009/0226612 A1    9/2009   Ogawa et al.
2014/0255606 A1    9/2014   Thompson et al.
2015/0093890 A1    4/2015   Blackwell et al.

FOREIGN PATENT DOCUMENTS

DE          DD113763 A1  *  6/1975
WO     WO 2007/005088 A2     1/2007
(Continued)

OTHER PUBLICATIONS

Walther DE patent DD0113763A1 Abstract (Year: 1975).*
(Continued)

*Primary Examiner* — Joseph A Miller, Jr.
(74) *Attorney, Agent, or Firm* — Oblon, McClelland, Maier & Neustadt, L.L.P.

(57) ABSTRACT

The present invention is in the field of processes for the generation of thin inorganic films on substrates, in particular atomic layer deposition processes. The present invention relates to a process comprising bringing a compound of general formula (I) into the gaseous or aerosol state and depositing the compound of general formula (I) from the gaseous or aerosol state onto a solid substrate, wherein M is Mn, Ni or Co, X is a ligand which coordinates M, n is 0, 1, or 2, $R^1$, $R^2$ are an alkyl group, an alkenyl group, an aryl group or a silyl group, m is 1, 2, or 3, $R^3$, $R^4$, and $R^5$ are an
(Continued)

alkyl group, an alkenyl group, an aryl group, an alkoxy group, or an aryloxy group, and p is 1, 2 or 3.

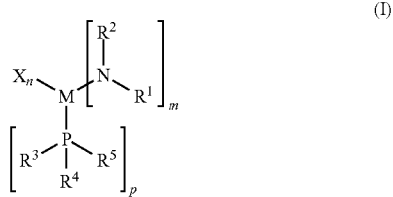

(I)

11 Claims, 2 Drawing Sheets (51) Int. Cl.
  C23C 16/18 (2006.01)
  C23C 16/455 (2006.01)
  C01B 33/06 (2006.01)
  C09D 5/02 (2006.01)
  H01L 21/285 (2006.01)
  H01L 21/768 (2006.01)

(52) U.S. Cl.
  CPC ........ C23C 16/18 (2013.01); C23C 16/45525 (2013.01); C23C 16/45553 (2013.01); H01L 21/28518 (2013.01); H01L 21/28556 (2013.01); H01L 21/76841 (2013.01)

(56) References Cited

FOREIGN PATENT DOCUMENTS

WO  WO 2014/052316 A1  4/2014
WO  WO 2015/088899 A1  6/2015

OTHER PUBLICATIONS

U.S. Appl. No. 15/114,666, filed Jul. 27, 2016, US 2016-0348243 A1, Ke Xu, et al.
U.S. Appl. No. 15/325,840, filed Jan. 12, 2017, US 2017-0175267 A1, Julia Strautmann, et al.
U.S. Appl. No. 15/501,631, filed Feb. 3, 2017, US 2017-0233865 A1, Julia Strautmann, et al.
U.S. Appl. No. 15/557,178, filed Sep. 11, 2017, US 2018-0044357 A1, Jan Spielmann, et al.
U.S. Appl. No. 15/775,856, filed May 14, 2018, Torben Adermann, et al.
U.S. Appl. No. 15/779,570, filed May 29, 2018, Falko Abels.
International Search Report dated Feb. 9, 2017 in PCT/EP2016/079213.
Extended European Search Report dated May 13, 2016 in Patent Application No. 15197604.0.
Aimee M. Bryan, et al., "Synthesis, Spectroscopic Characterization, and Determination of the Solution Association Energy of the Dimer $[Co\{N(SiMe_3)_2\}_2]_2$: Magnetic Studies of Low-Coordinate Co(II) Silylamides $[Co\{N(SiMe_3)_2\}_2L]$ (L = $PMe_3$, Pyridine, and THF) and Related Species That Reveal Evidence of Very Large Zero-Field Splittings", Inorganic Chemistry, vol. 52, No. 20, XP055270813A, 2013, pp. 12152-12160.
Hong Chen, et al., "Reactions of Low-Coordinate Transition-Metal Amides with Secondary Phosphanes and Arsanes: Synthesis, Structural, and Spectroscopic Studies of $[M\{N(SiMe_3)2\}(\mu\text{-}PMes_2)]_2$ (M = Mn, Fe), $[Mn\{N(SiMe_3)_2\}(\mu\text{-}AsMes_2)]_2$ and $Mes_2AsAsMes_2$", Inorganic Chemistry, vol. 30, No. 8, XP055340850A, 1991, pp. 1783-1787.
Andreas Eichhöfer, et al., "Slow Magnetic Relaxation in Trigonal-Planar Mononuclear Fe(II) and Co (II) Bis(trimethylsilyl)Amide Complexes-A Comparative Study", Inorganic Chemistry, vol. 53, No. 4, XP055270818A, Feb. 2014, pp. 1962-1974.
Nikolaos Liakakos, et al., "Oriented Metallic Nano-Objects on Crystalline Surfaces by Solution Epitaxial Growth", ACS Nano, vol. 9, No. 10, 2015, pp. 9665-9677.
Chengbao Ni, et al., "Two-coordinate, homoleptic manganese(II) primary terphenyl amido complexes: the effects of secondary coordination on geometry and Lewis base complexation", Dalton Transactions, vol. 39, XP055270795A, 2009, pp. 8349-8355.
Joseph H. Rivers, et al., "Synthesis and structures of Co bis-trifluoromethylpyrazolate complexes", Dalton Transactions, vol. 42, No. 36, XP055270797A, 2013, pp. 12898-12907.
Steven M. George, "Atomic Layer Deposition: An Overview", Chemical Review, vol. 110, No. 1, 2010, pp. 111-131.
Vyacheslav V. Sushev, et al., "Rearrangement of Phosphinohydrazide ligand—NPh—$N(PPh_2)_2$ in Transition Metal Coordination Sphere: Synthesis and Characterization of Nickel and Cobalt Spirocyclic Complexes $M(NPh—PPh_2=N—PPh_2)_2$ and Their Properties", Journal of Organometallic Chemistry, vol. 691, No. 5, XP028047827A, 2006, pp. 879-889.

* cited by examiner

PROCESS FOR THE GENERATION OF THIN INORGANIC FILMS

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements of the quality of such films become stricter. Thin inorganic films serve different purposes such as barrier layers, dielectrica, conducting features, capping, or separation of fine structures. Several methods for the generation of thin inorganic films are known. One of them is the deposition of film forming compounds from the gaseous state on a substrate. In order to bring metal atoms into the gaseous state at moderate temperatures, it is necessary to provide volatile precursors, e.g. by complexation the metals with suitable ligands. These ligands need to be removed after deposition of the complexed metals onto the substrate.

US 2014/0255606 A1 discloses bis(hexamethyldisilylamino) tetrahydrofurane cobalt for film deposition. However, this complex is not sufficiently stable upon vaporization and does not yield films of sufficient quality for some applications.

Bryan et al. disclose in Inorganic Chemistry, volume 52 (2013), pages 12152-12160 hexamethyldisilylamino trimethylphosphino cobalt. However, this compound is not used for film formation processes.

It was an object of the present invention to provide a process for the generation of Mn-, Ni- and/or Co-containing films of high quality and reproducibility on solid substrates under economically feasible conditions. It was desired that this process can be performed with as little decomposition of the precursor comprising Mn, Ni or Co as possible before it is in contact with the solid substrate. At the same time it was desired to provide a process in which the precursor is easily decomposed after deposited on a solid substrate. It was also aimed at providing a process using Mn-, Ni- or Co-containing precursors which can easily be modified and still remain stable in order to fit the precursor's properties to the particular needs.

These objects were achieved by a process comprising bringing a compound of general formula (I) into the gaseous or aerosol state (I)

and depositing the compound of general formula (I) from the gaseous or aerosol state onto a solid substrate, wherein
M is Mn, Ni or Co,
X is a ligand which coordinates M,
n is 0, 1, or 2,
$R^1$, $R^2$ are an alkyl group, an alkenyl group, an aryl group or a silyl group,
m is 1, 2, or 3,
$R^3$, $R^4$, and $R^5$ are an alkyl group, an alkenyl group, an aryl group, an alkoxy group, or an aryloxy group, and
p is 1, 2 or 3.

The present invention further relates to the use of a compound of general formula (I), wherein
M is Mn, Ni or Co,
X is a ligand which coordinates M,
n is 0, 1, or 2,
$R^1$, $R^2$ are an alkyl group, an alkenyl group, an aryl group or a silyl group,
m is 1, 2, or 3,
$R^3$, $R^4$, and $R^5$ are an alkyl group, an alkenyl group, an aryl group, an alkoxy group, or an aryloxy group, and
p is 1, 2 or 3
for a film formation process on a solid substrate.

The present invention further relates to a compound of general formula (I) wherein
M is Mn, Ni or Co,
X is a ligand which coordinates M,
n is 0, 1, or 2,
$R^1$, $R^2$ are an alkyl group, an alkenyl group, an aryl group or a silyl group,
m is 1, 2, or 3,
$R^3$, $R^4$, and $R^5$ are an alkyl group, an alkenyl group, an aryl group, an alkoxy group, or an aryloxy group, and
p is 1, 2 or 3 and
wherein one of $R^3$, $R^4$ and $R^5$ is different to the other two or all $R^3$, $R^4$ and $R^5$ are different to each other.

Preferred embodiments of the present invention can be found in the description and the claims. Combinations of different embodiments fall within the scope of the present invention.

In the compound of general formula (I) $R^1$ and $R^2$ are an alkyl group, an alkylene group, an aryl group or a silyl group, preferably an alkyl or silyl group, in particular a silyl group. $R^1$ and $R^2$ can be the same or different to each other. It has been observed that the vapor pressure of the compound of general formula (I) is lower if $R^1$ and $R^2$ are different to each other in comparison to a compound of general formula (I) having the same molecular weight in which $R^1$ and $R^2$ being the same. It is possible that $R^1$ and $R^2$ are connected to each other such that they form a ring including the nitrogen atom they are attached to. It is possible that this ring contains one or more double bonds if at least one $R^1$ and $R^2$ is an alkenyl or an aryl group. The index m can be 1, 2 or 3, preferably 2. If m is more than 1, i.e. more than one amine ligands $NR^1R^2$ are present in the compound of formula (I), the corresponding $R^1$ and $R^2$ in different amine ligands can be independent of each other the same or different to each other, preferably they are the same.

In the compound of general formula (I) $R^3$, $R^4$ and $R^5$ are an alkyl group, an alkenyl group, an aryl group, an alkoxy group, or an aryloxy group, preferably an alkyl group. $R^3$, $R^4$ and $R^5$ can be the same or two of $R^3$, $R^4$ and $R^5$ are the same and the remaining is different or all $R^3$, $R^4$ and $R^5$ are different to each other, preferably two of $R^3$, $R^4$ and $R^5$ are the same and the third is different to the other two or all $R^3$, $R^4$ and $R^5$ are different to each other, in particular two of $R^3$, $R^4$ and $R^5$ are the same and the third is different to the other two. It has been found out that in this case the vapor pressure of the compound of general formula (I) is lower in comparison to a compound of general formula (I) having the same molecular weight in which $R^3$, $R^4$ and $R^5$ being the same. It is possible that two of $R^3$, $R^4$ and $R^5$ are connected to each other such that they form a ring including the phosphor atom they are attached to. It is possible that this ring contains one or more double bonds if at least one of the ring forming $R^3$, $R^4$ or $R^5$ is an alkenyl or an aryl group. The index p can be 1, 2 or 3, preferably 1 or 2, in particular 1.

If n is more than 1, i.e. more than one phosphine ligands $PR^3R^4R^5$ are present in the compound of general formula (I), the corresponding $R^3$, $R^4$ and $R^5$ in different phosphine ligands can be independent of each other the same or different to each other, preferably they are the same. More preferably, the corresponding $R^3$, $R^4$ and $R^5$ in different phosphine ligands are the same and at the same time one of $R^3$, $R^4$ and $R^5$ is different to the other two.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, 2-ethyl-hexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, isopropyl or tert-butyl. Alkyl groups can be substituted, for example by halogens such as F, Cl, Br, I, in particular F; by hydroxyl groups; by ether groups; or by amines such as dialkylamines.

An alkenyl group contains at least one carbon-carbon double bond. The double bond can include the carbon atom with which the alkenyl group is bound to the rest of the molecule, or it can be placed further away from the place where the alkenyl group is bound to the rest of the molecule, preferably it is placed further away from the place where the alkenyl group is bound to the rest of the molecule. Alkenyl groups can be linear or branched. Examples for linear alkenyl groups in which the double bond includes the carbon atom with which the alkenyl group is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where alkenyl group is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which alkenyl group is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where alkenyl group is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopenta-dien-5-yl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A silyl group is a silicon atom with typically three substituents. Preferably a silyl group has the formula $SiY_3$, wherein Y is hydrogen, an alkyl group, an alkenyl group, an aryl group or a silyl group. It is possible that all three Y are the same or that two Y are the same and the remaining Y is different or that all three Y are different to each other. It is also possible that two Y together form a ring including the Si atom. Alkyl and aryl groups are as described above. Examples for siliyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, di methylcyclohexylsilyl, methyl-di-iso-propylsilyl, tri-phenylsilyl, phenylsilyl, dimethylphenylsilyl, pentamethyldisilyl.

An alkoxy group is an alkyl group which is attached to the residual molecule via an oxygen atom. An aryloxy group is an aryl group which is attached to the residual molecule via an oxygen atom.

According to the present invention the ligand X in the compound of general formula (I) can be any ligand which coordinates M. The index n can be 0, 1 or 2, preferably 0 or 1, in particular 0. If n is 2, i.e. the compound of general formula (I) contains two X, the two X can be the same or different to each other, preferably they are the same. Any or all X can be in any ligand sphere of M, e.g. in the inner ligand sphere, in the outer ligand sphere, or only loosely associated to M. Preferably, X is in the inner ligand sphere of M. It is believed that if all ligands X are in the inner ligand sphere of M the volatility of the compound of general formula (I) is high such that it can be brought into the gaseous or aerosol state without decomposition.

The ligand X in the compound of general formula (I) according to the present invention includes anions of halogens like fluoride, chloride, bromide or iodide and pseudohalogens like cyanide, isocyanide, cyanate, isocyanate, thiocyanate, isothiocyanate, or azide. Further suitable ligands X are alkyl anions like methyl, ethyl, butyl, or neopentyl anions as well as silicon bearing alkyl groups such as trimethylsilyl methyl. Another possible ligand X is hydride, nitric oxide (NO) and carbonmonoxide (CO).

Furthermore, X can be a ligand which coordinates M via a neutral or anionic nitrogen atom, for example by deprotonation before coordination to M. Preferably, X is a ligand which coordinates via at least two neutral or anionic nitrogen atoms. These include amidinates such as acetamidine or N,N'-bis-iso-propylacetamidine; guanidinates such as guanidine; aminoimines such as 2-N-tert-butylamino-2-methyl-propanal-N-tertbuylimine; diimines such as glyoxal-N,N'-bis-isopropyl-diimine, glyoxal-N,N'-bis-tert-butyl-diimine or 2,4-pentanedione-diimine; diketiminates such as N,N'-2,4-pentanediketiminate; iminopyrroles including pyrrol-2-carbald-alkylimines such as pyrrol-2-carbald-ethylimine, pyrrol-2-carbald-iso-propylimine or pyrrol-2-carbald-tert-butylimine as well as pyrrol-2,5-biscarbald-alkyldiimines such as pyrrol-2,5-biscarbald-tert-butyldiimine.

It is also possible that X is a ligand in which an oxygen atom coordinates to M. Examples are alkanolates, tetrahydrofurane, acetylacetonate, or 1,1,1,5,5,5-pentafluoroacetylacetone. Other suitable examples for X include both a nitrogen and an oxygen atom which both coordinate to M including dimethylamino-iso-propanol, formamide, acetamide, 2,4-pentandione-N-alkylimines such as 2,4-pentandione-N-iso-propylimine.

X can also be an unsaturated hydrocarbon which coordinates with a π-bond to M. These can be aliphatic or aromatic. Unsaturated hydrocarbons include olefins like ethylene, propylene, iso-butylene, cyclohexene, cyclooctene, cyclooctadiene, styrene; and alkynes like ethyne, propyne, 2-butyne. X can also be an unsaturated anionic hydrocarbon which can coordinate both via the anion and the unsaturated bond such as allyl, 2-methyl-allyl, or 1,3-bis(trimethylsilyl)-allyl. Aromatic X which coordinate via a π-bond to M include cyclopentadiene anions and its derivatives; benzene and its derivatives such as toluene or xylene.

Preferably, the ligand X is a ligand which coordinates M via a nitrogen or X is an aliphatic hydrocarbon, an alkanolate, cyanide, bromide, CO or NO. Particularly preferred ligands X are methyl, ethyl, propyl, neopentyl, trimethylsilyl methyl, allyl, 2-methyl-allyl, 1,3-bis(trimethylsilyl)-allyl, 2-N-tertbutylamino-2-methylpropanal-N-tertbutylimine, N,N'-bis-isopropylacetamidine, glyoxal-N,N'-bis-tertbutyl-diimine, glyoxal-N,N'-bis-isopropyl-diimine, pyrrol-2-carbald-isopropylimine or pyrrol-2-carbald-tert-butylimine, methanolate, ethanolate, CO, NO, cyanide, bromide, ethylene, cyclooctene, cyclooctadiene, or 2-butyne, in particular 2-methyl-allyl, N,N'-bis-isopropylacetamidine, glyoxal-N,N'-bis-tertbutyl-diimine, pyrrol-2-carbald-isopropylimine, CO, and NO.

The metal M is Mn, Ni or Co, i.e. manganese, nickel or cobalt, preferably Ni or Co, in particular Co. The metal M can be in various oxidation states, for example 0, +1, +2, +3, or +4. Preferably, X and n are chosen such that the compound of general formula (I) is electrically neutral.

It is preferred that the molecular weight of the compound of general formula (I) is up to 1000 g/mol, more preferred up to 800 g/mol, in particular up to 600 g/mol.

Some preferred examples for compounds of general formula (I) are given in the following table.

| No. | $R^1$ | $R^2$ | m | $R^3$ | $R^4$ | $R^5$ | p | M | X | n |
|---|---|---|---|---|---|---|---|---|---|---|
| C-1 | TMS | TMS | 2 | methyl | methyl | methyl | 1 | Co | — | 0 |
| C-2 | TMS | TMS | 2 | ethyl | ethyl | ethyl | 1 | Co | — | 0 |
| C-3 | TMS | TMS | 2 | methyl | methyl | tertbutyl | 1 | Co | — | 0 |
| C-4 | TMS | TMS | 2 | isopropyl | isopropyl | isopropyl | 1 | Co | — | 0 |
| C-5 | TMS | TMS | 2 | isopropyl | isopropyl | tertbutyl | 1 | Co | — | 0 |
| C-6 | tertbutyl | TMS | 2 | methyl | methyl | methyl | 1 | Co | — | 0 |
| C-7 | tertbutyl | TMS | 2 | ethyl | ethyl | ethyl | 1 | Co | — | 0 |
| C-8 | tertbutyl | TMS | 2 | methyl | methyl | tertbutyl | 1 | Co | — | 0 |
| C-9 | tertbutyl | TMS | 2 | isopropyl | isopropyl | tertbutyl | 1 | Co | — | 0 |
| C-10 | tertbutyl | tertbutyl | 2 | methyl | methyl | methyl | 1 | Co | — | 0 |
| C-11 | tertbutyl | tertbutyl | 2 | ethyl | ethyl | ethyl | 1 | Co | — | 0 |
| C-12 | tertbutyl | tertbutyl | 2 | methyl | methyl | tertbutyl | 1 | Co | — | 0 |
| C-13 | tertbutyl | tertbutyl | 2 | isopropyl | isopropyl | tertbutyl | 1 | Co | — | 0 |
| C-14 | TMS | TMS | 1 | ethyl | ethyl | ethyl | 1 | Co | CO | 1 |
| C-15 | $R^1$ and $R^2$ form together with the N-atom TMP | | 2 | methyl | methyl | methyl | 1 | Co | — | 0 |
| C-16 | $R^1$ and $R^2$ form together with the N-atom TMP | | 2 | ethyl | ethyl | ethyl | 1 | Co | — | 0 |
| C-17 | $R^1$ and $R^2$ form together with the N-atom TMP | | 2 | methyl | methyl | tertbutyl | 1 | Co | — | 0 |
| C-18 | $R^1$ and $R^2$ form together with the N-atom TMP | | 2 | isopropyl | isopropyl | tertbutyl | 1 | Co | — | 0 |
| C-19 | TMS | TMS | 1 | methyl | methyl | methyl | 2 | Co | — | 0 |
| C-20 | TMS | TMS | 1 | methyl | methyl | tertbutyl | 2 | Co | — | 0 |
| C-21 | TMS | TMS | 1 | methyl | methyl | methyl | 1 | Co | COD | 1 |
| C-22 | TMS | TMS | 1 | methyl | methyl | methyl | 1 | Co | DPMA | 1 |
| C-23 | TMS | TMS | 1 | isopropyl | isopropyl | isopropyl | 1 | Co | TMS-Me | 1 |
| C-24 | TMS | TMS | 1 | isopropyl | isopropyl | tertbutyl | 1 | Co | TMS-Me | 1 |
| C-25 | TMS | TMS | 1 | isopropyl | isopropyl | tertbutyl | 1 | Co | neopentyl | 1 |
| C-26 | TMS | TMS | 1 | methyl | methyl | methyl | 1 | Co | TAMPTI | 1 |
| C-27 | TMS | TMS | 1 | methyl | methyl | methyl | 1 | Co | HMG | 1 |
| C-28 | TMS | TMS | 1 | methyl | methyl | methyl | 1 | Co | PCII | 1 |
| C-29 | TMS | TMS | 2 | methyl | methyl | methyl | 1 | Ni | — | 0 |
| C-30 | TMS | TMS | 2 | ethyl | ethyl | ethyl | 1 | Ni | — | 0 |
| C-31 | TMS | TMS | 2 | methyl | methyl | tertbutyl | 1 | Ni | — | 0 |
| C-32 | TMS | TMS | 2 | isopropyl | isopropyl | tertbutyl | 1 | Ni | — | 0 |
| C-33 | TMS | TMS | 1 | isopropyl | isopropyl | tertbutyl | 1 | Ni | NO | 1 |
| C-34 | tertbutyl | TMS | 2 | methyl | methyl | methyl | 1 | Ni | — | 0 |
| C-35 | tertbutyl | TMS | 2 | isopropyl | isopropyl | tertbutyl | 1 | Ni | — | 0 |
| C-36 | TMS | TMS | 1 | methyl | methyl | methyl | 2 | Ni | DPMA | 1 |
| C-37 | TMS | TMS | 1 | methyl | methyl | methyl | 1 | Ni | 2-Me-allyl | 1 |
| C-38 | TMS | TMS | 1 | methyl | methyl | tertbutyl | 1 | Ni | 2-Me-allyl | 1 |
| C-39 | TMS | TMS | 1 | methyl | methyl | methyl | 1 | Ni | DPMA | 1 |
| C-40 | TMS | TMS | 1 | isopropyl | isopropyl | tertbutyl | 1 | Ni | TMS-Me | 1 |
| C-41 | TMS | TMS | 1 | methyl | methyl | methyl | 2 | Ni | TMS-Me | 1 |
| C-42 | TMS | TMS | 1 | methyl | methyl | methyl | 1 | Ni | TAMPTI | 1 |
| C-43 | TMS | TMS | 1 | methyl | methyl | methyl | 1 | Ni | HMG | 1 |
| C-44 | TMS | TMS | 1 | methyl | methyl | methyl | 1 | Ni | PCII | 1 |
| C-45 | TMS | TMS | 2 | methyl | methyl | methyl | 1 | Mn | — | 0 |
| C-46 | TMS | TMS | 2 | methyl | methyl | methyl | 2 | Mn | — | 0 |
| C-47 | TMS | TMS | 2 | methyl | methyl | methyl | 1 | Mn | CO | 1 |
| C-48 | TMS | TMS | 2 | methyl | methyl | methyl | 1 | Mn | CO | 2 |
| C-49 | TMS | TMS | 2 | ethyl | ethyl | ethyl | 1 | Mn | — | 0 |
| C-50 | TMS | TMS | 2 | isopropyl | isopropyl | tertbutyl | 1 | Mn | — | 0 |

-continued

| No. | R$^1$ | R$^2$ | m | R$^3$ | R$^4$ | R$^5$ | p | M | X | n |
|---|---|---|---|---|---|---|---|---|---|---|
| C-51 | tertbutyl | TMS | 2 | methyl | methyl | methyl | 1 | Mn | — | 0 |
| C-52 | TMS | TMS | 1 | methyl | methyl | methyl | 1 | Mn | BTMSA | 1 |

COD stands for 1,5-cyclooctadiene,
DPMA for N,N-diisopropyl-2-methylamidinate,
TMS-Me for trimethylsilyl methyl,
HMG for hexamethylguanidinate,
TAMPTI for 2-N-tertbutylamino-2-methyl-propanal-N-tertbutylimine,
PCII for pyrrol-2-carbald-isopropylimine,
TMS for trimethylsilyl,
TMP for 2,2,6,6-tetramethylpiperdine,
BTMSA for 1,3-bis(trimethylsiyl)-allyl.

The compound of general formula (I) used in the process according to the present invention is preferably used at high purity to achieve best results. High purity means that the substance employed contains at least 90 wt.-% compound of general formula (I), preferably at least 95 wt.-% compound of general formula (I), more preferably at least 98 wt.-% compound of general formula (I), in particular at least 99 wt.-% compound of general formula (I). The purity can be determined by elemental analysis according to DIN 51721 (Prüfung fester Brennstoffe—Bestimmung des Gehaltes an Kohlenstoff and Wasserstoff—Verfahren nach Radmacher-Hoverath, August 2001).

In the process according to the present invention the compound of general formula (I) is brought into the gaseous or aerosol state. This can be achieved by heating the compound of general formula (I) to elevated temperatures. In any case a temperature below the decomposition temperature of the compound of general formula (I) has to be chosen. Preferably, the heating temperature ranges from slightly above room temperature to 300° C., more preferably from 30° C. to 250° C., even more preferably from 40° C. to 200° C., in particular from 50° C. to 150° C.

Another way of bringing the compound of general formula (I) into the gaseous or aerosol state is direct liquid injection (DLI) as described for example in US 2009/0226612 A1. In this method the compound of general formula (I) is typically dissolved in a solvent and sprayed in a carrier gas or vacuum. Depending on the vapor pressure of the compound of general formula (I), the temperature and the pressure the compound of general formula (I) is either brought into the gaseous state or into the aerosol state. Various solvents can be used provided that the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable. The aerosol comprising the compound of general formula (I) should contain very fine liquid droplets or solid particles. Preferably, the liquid droplets or solid particles have a weight average diameter of not more than 500 nm, more preferably not more than 100 nm. The weight average diameter of liquid droplets or solid particles can be determined by dynamic light scattering as described in ISO 22412:2008. It is also possible that a part of the compound of general formula (I) is in the gaseous state and the rest is in the aerosol state, for example due to a limited vapor pressure of the compound of general formula (I) leading to partial evaporation of the compound of general formula (I) in the aerosol state.

Alternatively, the metal-containing compound can be brought into the gaseous state by direct liquid evaporation (DLE) as described for example by J. Yang et al. (Journal of Materials Chemistry C, 2015). In this method, the metal-containing compound or the reducing agent is mixed with a solvent, for example a hydrocarbon such as tetradecane, and heated below the boiling point of the solvent. By evaporation of the solvent, the metal-containing compound or the reducing agent is brought into the gaseous state. This method has the advantage that no particulate contaminants are formed on the surface.

It is preferred to bring the compound of general formula (I) into the gaseous or aerosol state at decreased pressure. In this way, the process can usually be performed at lower heating temperatures leading to decreased decomposition of the compound of general formula (I). It is also possible to use increased pressure to push the compound of general formula (I) in the gaseous or aerosol state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

In the process according to the present invention a compound of general formula (I) is deposited on a solid substrate from the gaseous or aerosol state. The solid substrate can be any solid material. These include for example metals, semi-metals, oxides, nitrides, and polymers. It is also possible that the substrate is a mixture of different materials. Examples for metals are tantalum, tungsten, cobalt, nickel, platinum, ruthenium, palladium, manganese, aluminum, steel, zinc, and copper. Examples for semimetals are silicon, germanium, and gallium arsenide. Examples for oxides are silicon dioxide, titanium dioxide, zirconium oxide, and zinc oxide. Examples for nitrides are silicon nitride, aluminum nitride, titanium nitride, tantalum nitride and gallium nitride. Examples for polymers are polyethylene terephthalate (PET), polyethylene naphthalenedicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the compound of general formula (I) is deposited onto them, it is preferably to keep them in motion. This can, for example, be achieved by stirring, by rotating drums, or by fluidized bed techniques.

The deposition takes place if the substrate comes in contact with the compound of general formula (I). Generally, the deposition process can be conducted in two different ways: either the substrate is heated above or below the decomposition temperature of the compound of general formula (I). If the substrate is heated above the decomposition temperature of the compound of general formula (I), the compound of general formula (I) continuously decomposes on the surface of the solid substrate as long as more compound of general formula (I) in the gaseous or aerosol state reaches the surface of the solid substrate. This process is typically called chemical vapor deposition (CVD). Usually, an inorganic layer of homogeneous composition, e.g. the metal oxide or nitride, is formed on the solid substrate as the organic material is desorbed from the metal M. Typically the solid substrate is heated to a temperature in the range of 300 to 1000° C., preferably in the range of 350 to 600° C.

Alternatively, the substrate is below the decomposition temperature of the compound of general formula (I). Typically, the solid substrate is at a temperature equal to or lower than the temperature of the place where the compound of general formula (I) is brought into the gaseous or aerosol state, often at room temperature or only slightly above. Preferably, the temperature of the substrate is at least 30° C. lower than the place where the compound of general formula (I) is brought into the gaseous or aerosol state. Preferably, the temperature of the substrate is from room temperature to 400° C., more preferably from 100 to 300° C., such as 150 to 220° C.

The deposition of compound of general formula (I) onto the solid substrate is either a physisorption or a chemisorption process. Preferably, the compound of general formula (I) is chemisorbed on the solid substrate. One can determine if the compound of general formula (I) chemisorbs to the solid substrate by exposing a quartz microbalance with a quartz crystal having the surface of the substrate in question to the compound of general formula (I) in the gaseous or aerosol state. The mass increase is recorded by the eigen frequency of the quartz crystal. Upon evacuation of the chamber in which the quartz crystal is placed the mass should not decrease to the initial mass, but about a monolayer of the residual compound of general formula (I) remains if chemisorption has taken place. In most cases where chemisorption of the compound of general formula (I) to the solid substrate occurs, the x-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the compound of general formula (I), typically a monolayer is deposited on the solid substrate. Once a molecule of general formula (I) is deposited on the solid substrate further deposition on top of it usually becomes less likely. Thus, the deposition of the compound of general formula (I) on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen and dielektrischen Materialeigenschaften sowie der Schichtdicke dünner Schichten mittels Ellipsometrie; February 2004).

Often it is desired to build up thicker layers than those just described. In order to achieve this in the process according to the present invention it is preferable to decompose the deposited compound of general formula (I) by removal of all ligands after which further compound of general formula (I) is deposited. This sequence is preferably performed at least twice, more preferably at least 10 times, in particular at least 50 times. Removing all ligands in the context of the present invention means that at least 95 wt.-% of the total weight of the ligands in the deposited compound of general formula (I) are removed, preferably at least 98 wt.-%, in particular at least 99 wt.-%. The decomposition can be effected in various ways. The temperature of the solid substrate can be increased above the decomposition temperature.

Furthermore, it is possible to expose the deposited compound of general formula (I) to a plasma like an oxygen plasma or a hydrogen plasma; to oxidants like oxygen, oxygen radicals, ozone, nitrous oxide ($N_2O$), nitric oxide (NO), nitrogendioxde ($NO_2$) or hydrogenperoxide; to reducing agents like hydrogen, alcohols, hydroazine or hydroxylamine; or solvents like water. It is preferable to use oxidants, plasma or water to obtain a layer of a metal oxide. Exposure to water, an oxygen plasma or ozone is preferred. Exposure to water is particularly preferred. If layers of elemental metal are desired it is preferable to use reducing agents. Preferred examples are hydrogen, hydrogen radicals, hydrogen plasma, ammonia, ammonia radicals, ammonia plasma, ammonia derivatives like tert-butylamine, iso-propylamine, dimethylamine, methylethylamine, or diethylamine; hydrazine or hydrazine derivatives like N,N-dimethylhydrazine; silane, disilane, trisilane, cyclopentasilane, cyclohexasilane, dimethylsilane, diethylsilane, or trisilylamine; more preferably hydrogen, hydrogen radicals, hydrogen plasma, ammonia, ammonia radicals, ammonia plasma, hydrazine, N,N-dimethylhydrazine, silane; in particular hydrogen. The reducing agent can either directly cause the decomposition of the deposited compound of general formula (I) or it can be applied after the decomposition of the deposited compound of general formula (I) by a different agent, for example water. For layers of metal nitrides it is preferable to use ammonia or hydrazine. Typically, a low decomposition time and high purity of the generated film is observed.

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (I) is very versatile, so the process parameters can be varied in a broad range. Therefore, the process according to the present invention includes both a CVD process as well as an ALD process.

Depending on the number of sequences of the process according to the present invention performed as ALD process, films of various thicknesses are generated. Preferably, the sequence of depositing the compound of general formula (I) onto a solid substrate and decomposing the deposited compound of general formula (I) is performed at least twice. This sequence can be repeated many times, for example 10 to 500, such as 50 or 100 times. Usually, this sequence is not repeated more often than 1000 times. Ideally, the thickness of the film is proportional to the number of sequences performed. However, in practice some deviations from proportionality are observed for the first 30 to 50 sequences. It is assumed that irregularities of the surface structure of the solid substrate cause this non-proportionality.

One sequence of the process according to the present invention can take from milliseconds to several minutes, preferably from 0.1 second to 1 minute, in particular from 1 to 10 seconds. The longer the solid substrate at a temperature below the decomposition temperature of the compound of general formula (I) is exposed to the compound of general formula (I) the more regular films formed with less defects.

The compound of general formula (I) in which one of $R^3$, $R^4$ and $R^5$ is different to the other two or all $R^3$, $R^4$ and $R^5$ are different to each other is particularly well suited for the process according to the present invention. Therefore, the present invention further relates to the compound of general formula (I) in which one of $R^3$, $R^4$ and $R^5$ is different to the other two or all $R^3$, $R^4$ and $R^5$ are different to each other. The definitions and preferred embodiments of the variables in the compound of general formula (I) are as described for the process above.

The process according to the present invention yields a film. A film can be only one monolayer of deposited compound of formula (I), several consecutively deposited and decomposed layers of the compound of general formula (I), or several different layers wherein at least one layer in the film was generated by using the compound of general formula (I). A film can contain defects like holes. These defects, however, generally constitute less than half of the surface area covered by the film. The film is preferably an inorganic film. In order to generate an inorganic film, all organic ligands have to be removed from the film as described above. More preferably, the film is an elemental metal film. The film can have a thickness of 0.1 nm to 1 μm or above depending on the film formation process as described above. Preferably, the film has a thickness of 0.5 to 50 nm. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 10 nm to 100 μm, such as 100 nm or 1 μm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film according to the present invention serves to increase the reflective index of the layer which reflects light. An example for a sensor is an oxygen sensor, in which the film can serve as oxygen conductor, for example if a metal oxide film is prepared. In field-effect transistors out of metal oxide semiconductor (MOS-FET) the film can act as dielectric layer or as diffusion barrier. It is also possible to make semiconductor layers out of the films in which elemental nickel-silicon is deposited on a solid substrate.

Preferred electronic elements are transistors. Preferably, the film acts as diffusion barrier, contact, liner or capping layer in a transistor. Diffusion barriers of manganese or cobalt are particularly useful to avoid diffusion of copper contacts into the dielectric, often applied as self-forming copper barrier. If the transistor is made of silicon, it is possible that after deposition of nickel or cobalt and heating some silicon diffuses into the nickel to form for example $NiSi$ or $CoSi_2$.

EXAMPLES

Example 1 (Comparative Example)

C-0

A cooled solution of $NaN(SiMe_3)_2$ (7.34 g, 40.0 mmol) in THF (40 mL, −36° C.) was added dropwise to a cooled slurry of $CoCl_2$ (2.60 g, 20.0 mmol) in THF (20 mL, −36° C.). A color-change from blue to green was observed. After stirring for 1 h at room temperature all volatiles were removed under vacuum. The dark green solid was extracted with pentanes (3×30 mL) and filtered through a P3 glass frit. Removal of the solvent yielded C-0 as green crystals (7.01 g, 77.5%). Dual Sublimation (40° C./1 mtorr) for 20 h respectively afforded an analytically pure sample. Crystals for X-ray crystallography were obtained by slow evaporation of a solution in pentane at −36° C.

$^1$H-NMR (300 MHz, $C_6D_6$): δ (ppm)=162.6 (br, 4H, $CH_2CH_2O$ or $CH_2CH_2O$), 97.0 (br, 4H, $CH_2CH_2O$ or $CH_2CH_2O$), −16.4 (br, 36H, $SiMe_3$).

Elemental analysis: Calculated for $C_{16}H_{44}CoN_2OSi_4$: C, 42.53; H, 9.82; N, 6.20. Found: C, 42.05; H, 10.58; N, 6.20.

Figure 1:
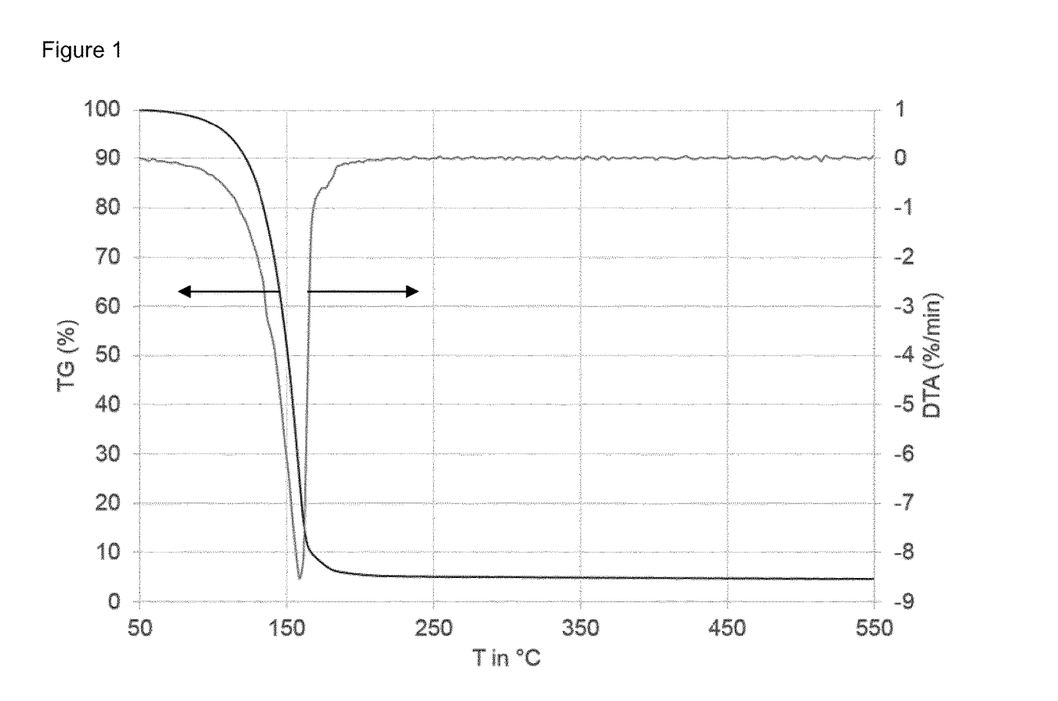
FIGS. 1 to 4 depict the thermal gravimetric data of the compounds in the examples.

C-0 has a vapor pressure of 1 mbar at 102° C. Upon sublimation, a metallic residue is observed at the place of vaporization. The thermogravimetric (TG) analysis including the differential thermogravimetry (DTA) is shown in FIG. 1. The residual mass at 300° C. is 5.1%, the maximum DTA is at 159° C.

Example 2

C-1

$PMe_3$ (0.25 mL, 2.42 mmol) solved in cold $Et_2O$ (2 mL, −36° C.) was added dropwise to cooled solution of C-0 (1.0 g, 2.21 mmol) in $Et_2O$ (3 mL, −36° C.). No color change was observed. Stirring at room temperature for 16 h resulted in a turquoise solution. Removing of the solvent under vacuum afforded C-1 as crude product (966 mg). Sublimation (75°

C./1 mtorr) for 14 h gave an analytically pure sample as a turquoise solid (608 mg, 60%). Crystals for X-ray crystallography were obtained by slow evaporation of a pentanes-solution at −36° C.

$^1$H-NMR (300 MHz, C$_6$D$_6$): δ (ppm)=168.8 (br, 9H, PMe$_3$), −24.2 (br, 36H, SiMe$_3$).

Elemental analysis: Calculated for C$_{15}$H$_{45}$CoN$_2$PSi$_4$: C, 39.53; H, 9.95; N, 6.15. Found: C, 39.04; H, 10.43; N, 5.97.

Figure 2:
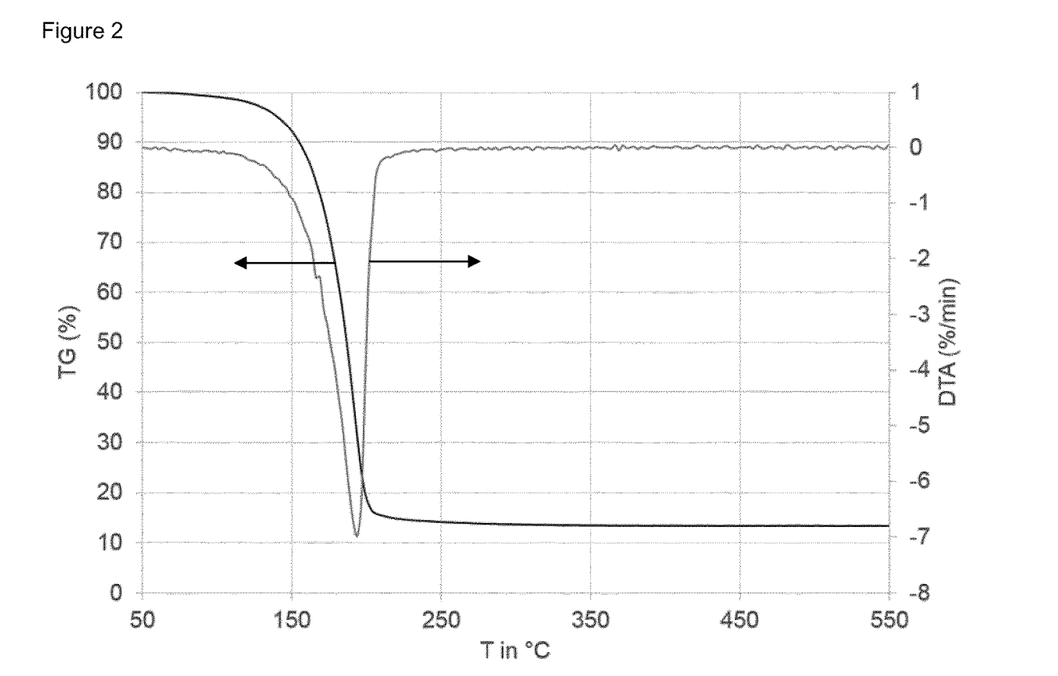

C-1 has a vapor pressure of 1 mbar at 138° C. Upon sublimation, no residue is observed at the place of vaporization. TG and DTA are shown in FIG. 2. The residual mass at 300° C. is 14.1%, the maximum DTA is at 193° C.

Example 3

C-2

P(i-Pr)$_3$ (0.35 mL, 1.77 mmol) solved in cold Et$_2$O (2 mL, −36° C.) was added dropwise to cooled solution) of C-0 (800 mg, 1.77 mmol) in Et$_2$O (3 mL, (−36° C.). Stirring at room temperature for three days resulted in a green solution. Removing of the solvent under vacuum afforded 3 as crude product. Sublimation (80° C./1 mtorr) for 17 h gave an analytically pure sample of bright green solid (714 mg, 75%). Crystals for X-ray crystallography were obtained by slow evaporation of a pentanes-solution at −36° C.

$^1$H-NMR (300 MHz, C$_6$D$_6$): δ (ppm)=175.5 (br, P(CH(CH$_3$)$_2$)$_3$), 31.7 (br, 18H, P(CH(CH$_3$)$_2$)$_3$), 19.6 (br, 36H, SiMe$_3$).

Elemental analysis: Calculated for C$_{21}$H$_{57}$CoN$_2$PSi$_4$: C, 46.71; H, 10.64; N, 5.19. Found: C, 46.01; H, 11.72; N, 5.08.

Figure 3:
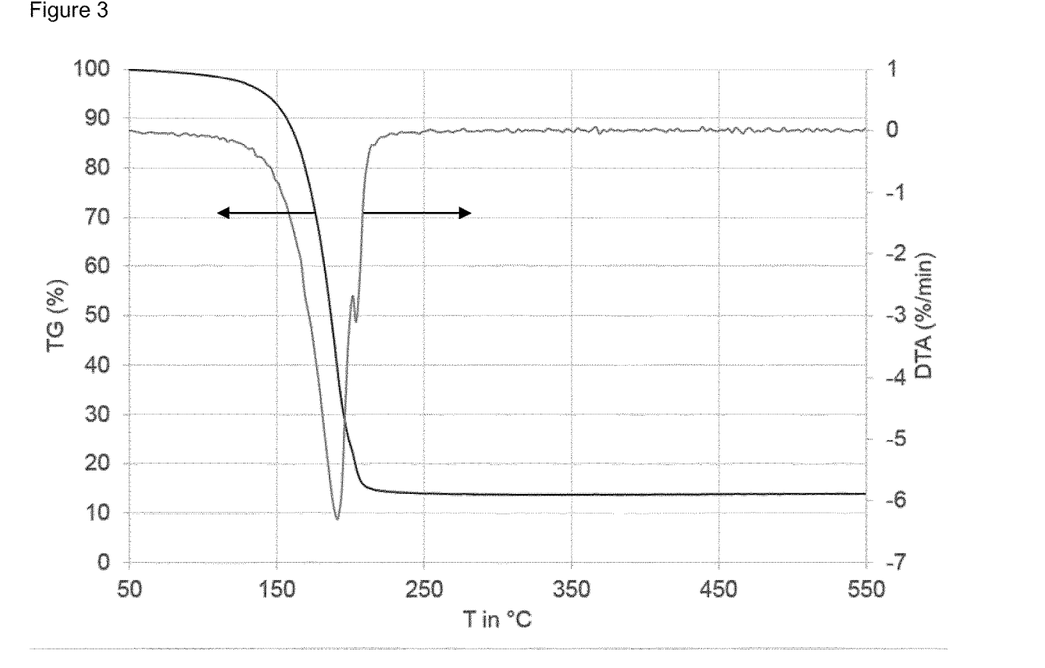

C-2 has a vapor pressure of 1 mbar at 133° C. Upon sublimation, no residue is observed at the place of vaporization. TG and DTA are shown in FIG. 3. The residual mass at 300° C. is 14.3%, the maximum DTA is at 191° C.

Example 4

C-3

PMe$_2$t-Bu (0.25 mL, 1.80 mmol) solved in cold Et$_2$O (2 mL, −36° C.) was added dropwise to cooled solution of C-0 (813 mg, 1.80 mmol) in Et$_2$O (3 mL, −36° C.). Stirring at room temperature for 17 h resulted in a green solution. Removing of the solvent afforded C-3 as crude product. Sublimation (60° C./1 mtorr) for 22 h gave an analytically pure sample of green solid (545 mg, 51%). Crystals for X-ray crystallography were obtained by slow evaporation of a pentanes-solution at −36° C.

$^1$H-NMR (300 MHz, C$_6$D$_6$): δ (ppm)=152.1 (br, 6H, PMe$_2$t-Bu), 54.6 (br, 9H, PMe$_2$t-Bu), 21.8 (br, 36H, SiMe$_3$).

Elemental analysis: Calculated for C$_{18}$H$_{51}$CoN$_2$PSi$_4$: C, 43.42; H, 10.33; N, 5.63. Found: C, 41.00; H, 9.94; N, 5.85.

Example 5

C-4

Pi-Pr$_2$t-Bu (0.28 mL, 1.30 mmol) solved in cold Et$_2$O (5 mL, −36° C.) was added dropwise to cooled solution of C-0 (587 mg, 1.30 mmol) in Et$_2$O (2 mL, −36° C.). Stirring at room temperature for 23 h resulted in a green solution. Removing of the solvent under vacuum afforded C-4 as green oil. Drying in vacuum for 9 h gave a green solid as crude product. Sublimation (60° C./1 mtorr) for 22 h gave an analytically pure sample of green solid (320 mg, 44%). Crystals for X-ray crystallography were obtained by slow evaporation of a pentanes-solution at room temperature.

$^1$H-NMR (300 MHz, C$_6$D$_6$): δ (ppm)=120.8 (br, P(CH(CH$_3$)$_2$)t-Bu), 31.0 (br, 6H, P(CHCH$_3$CH$_3$)t-Bu or P(CHCH$_3$CH$_3$)t-Bu), 27.5 (br, 9H P(CH(CH$_3$)$_2$)t-Bu), 22.4 (br, 6H, P(CHCH$_3$CH$_3$)t-Bu or P(CHCH$_3$CH$_3$)t-Bu), 16.5 (br, 36H, SiMe$_3$).

Elemental analysis: Calculated for C$_{22}$H$_{66}$CoN$_2$PSi$_4$: C, 46.70; H, 10.96; N, 4.80. Found: C, 47.70; H, 10.74; N, 5.06.

Figure 4:
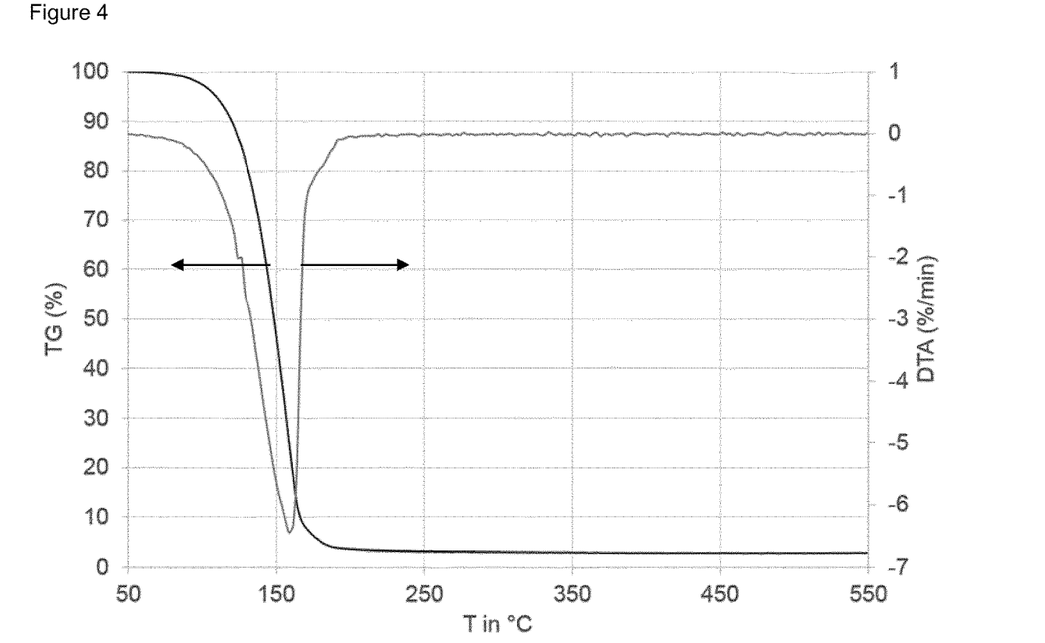

C-4 has a vapor pressure of 1 mbar at 100° C. Upon sublimation, no residue is observed at the place of vaporization. TG and DTA are shown in FIG. 4. The residual mass at 300° C. is 3.3%, the maximum DTA is at 159° C.

The invention claimed is:
1. A process, comprising:
bringing a compound of formula (I):

(I)

into a gaseous or aerosol state, and
depositing the compound from the gaseous or aerosol state onto a solid substrate, thereby forming a deposited compound, wherein M is Mn, Ni or Co, X is a ligand which coordinates M, n is 0, 1, or 2, $R^1$, $R^2$ are an alkyl group, an alkenyl group, an aryl group or a silyl group, m is 1, 2, or 3, $R^3$, $R^4$, and $R^5$ are an alkyl group, an alkenyl group, an aryl group, an alkoxy group, or an aryloxy group, and p is 1, 2 or 3.

2. The process according to claim 1, wherein only two of $R^3$, $R^4$ and $R^5$ are the same or all $R^3$, $R^4$ and $R^5$ are different to each other.

3. The process according to claim 1, wherein n is 0, m is 2 and p is 1.

4. The process according to claim 1, wherein $R^1$ and $R^2$ are a silyl group.

5. The process according to claim 1, wherein $R^3$, $R^4$ and $R^5$ are methyl, ethyl, iso-propyl or tert-butyl.

6. The process according to claim 1, wherein M is Co.

7. The process according to claim 1, further comprising: chemisorbing the compound on a surface of the solid substrate.

8. The process according to claim 1, further comprising: decomposing the deposited compound by removing all ligands.

9. The process according to claim 8, further comprising: exposing the deposited compound to a reducing agent.

10. The process according to claim 8, wherein a sequence of the depositing the compound onto the solid substrate and the decomposing the deposited compound is performed at least twice.

11. A process for forming a film on a solid substrate, comprising:

applying, to the solid substrate, a compound of formula (I), wherein M is Mn, Ni or Co, X is a ligand which coordinates M, n is 0, 1, or 2, $R^1$, $R^2$ are an alkyl group, an alkenyl group, an aryl group or a silyl group, m is 1, 2, or 3, $R^3$, $R^4$, and $R^5$ are an alkyl group, an alkenyl group, an aryl group, an alkoxy group, or an aryloxy group, and p is 1, 2 or 3.

* * * * *

UNITED STATES PATENT AND TRADEMARK OFFICE
CERTIFICATE OF CORRECTION

PATENT NO. : 10,669,297 B2
APPLICATION NO. : 15/779893
DATED : June 2, 2020
INVENTOR(S) : Torben Adermann et al.

Page 1 of 1

It is certified that error appears in the above-identified patent and that said Letters Patent is hereby corrected as shown below:

On the Title Page

Page 2, in Column 2, item (56), Other Publications, Line 21, "Studies of [M{N(SiMe$_3$)2}(μ-Pmes$_2$)]$_2$" should read -- Studies of [M{N(SiMe$_3$)$_2$}(μ-Pmes$_2$)]$_2$ --.

In the Specification

Column 3, Line 48, "anthrancenyl," should read -- anthracenyl, --;
    Line 66, "siliyl groups" should read -- silyl groups --.

Column 4, Lines 1-2, "di methylcyclohexylsilyl," should read -- dimethylcyclohexylsilyl, --.

Columns 7-8, Line 12, "tetramethylpiperdine," should read -- tetramethylpiperidine, --;
    Line 13, "(trimethylsiyl)" should read -- (trimethylsilyl) --;
    Line 26, "Kohlenstoff and Wasserstoff" should read -- Kohlenstoff und Wasserstoff --.

Column 9, Line 61, "optischen and dielektrischen" should read -- optischen und dielektrischen --.

Column 10, Line 15, "nitrogendioxde" should read -- nitrogen dioxide --.

Column 14, Line 44, delete "$C_{22}H_{66}CoN_2PSi_4$:" and insert -- $C_{22}H_{59}CoN_2PSi_4$: --.

Signed and Sealed this
Fifteenth Day of September, 2020

Andrei Iancu
*Director of the United States Patent and Trademark Office*